(12) United States Patent
Riess et al.

(10) Patent No.: US 7,686,886 B2
(45) Date of Patent: Mar. 30, 2010

(54) CONTROLLED SHAPE SEMICONDUCTOR LAYER BY SELECTIVE EPITAXY UNDER SEED STRUCTURE

(75) Inventors: Walter H Riess, Thalwil (CH); Heike E Riel, Rueschlikon (CH); Siegfried F Karg, Adliswil (CH); Heinz Schmid, Waedenswil (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/535,122

(22) Filed: Sep. 26, 2006

(65) Prior Publication Data

US 2008/0072816 A1     Mar. 27, 2008

(51) Int. Cl.
    *C30B 25/00*     (2006.01)
(52) U.S. Cl. .............................. 117/90; 117/94; 117/97; 117/101; 117/106; 117/902; 117/921; 117/935
(58) Field of Classification Search .................... 117/1, 117/90, 94, 97, 101, 106, 921, 902, 935; 257/1; 423/1; 438/1
    See application file for complete search history.

(56) References Cited

U.S. PATENT DOCUMENTS

| 3,346,414 | A | 10/1967 | Ellis et al. |
| 4,789,537 | A | 12/1988 | Shalek et al. |
| 6,911,373 | B2 * | 6/2005 | Kellar et al. ................. 438/399 |
| 2002/0175408 | A1 * | 11/2002 | Majumdar et al. .......... 257/734 |
| 2004/0005723 | A1 * | 1/2004 | Empedocles et al. ........... 438/1 |
| 2005/0011431 | A1 * | 1/2005 | Samuelson et al. ............ 117/40 |

OTHER PUBLICATIONS

Lauhon et al., "Epitaxial core-shell and core-multishell nanowire heterostructures," Nature, vol. 420, Nov. 2002, pp. 57-61.*
E.I. Givargizov, Highly Anisotropic Crystals, 1987, pp. 77, Reidel Publishing Co., Dordrecht, Holland.
Erik P. A. M. Bakkers and Marcel A. Verheijen, Synthesis of InP Nanotubes, J. Am. Chem. Soc., 2003, pp. 3440-3441, 125 (12), ACS publications, American Chemical Society, USA.

* cited by examiner

*Primary Examiner*—Robert M Kunemund
*Assistant Examiner*—Matthew J Song
(74) *Attorney, Agent, or Firm*—Eustus D. Nelson; Stephen C. Kaufman; Daryl K. Neff

(57) ABSTRACT

A method for forming a structure of a desired cross-section on a substrate is provided. The method provides a seed structure comprising at least one support layer on the substrate. The support layer has a geometric shape related to the desired cross-section of the structure and is diffusive to a precursor constituent. The method further includes growing the structure by supplying at least one precursor constituent on the substrate. The desired cross-section of the structure is defined by the geometric shape of at least one support layer.

18 Claims, 7 Drawing Sheets

CONTROLLED SHAPE SEMICONDUCTOR LAYER BY SELECTIVE EPITAXY UNDER SEED STRUCTURE

FIELD OF THE INVENTION

The invention relates to a crystalline structure and to a method for forming such a crystalline structure. More particularly, the present invention relates to a method of growing a crystalline structure having a desired cross-section.

BACKGROUND

The semiconductor industry is facing increasing pressure and challenges to continually shrink the dimensions of semiconductor devices. The conventional top-down method of fabricating defect-free, arbitrary shaped, ultra-small semiconducting structures and devices has its limitations. The top-down method is largely an extension of micro-fabrication methods used for fabricating single crystalline structures.

The single crystalline structures are the basic building blocks of micro-technological and nano-technological systems, including transistors, Field Effect Transistors (FETs), sensors, Micro-Electro-Mechanical Systems (MEMS) devices and light emitting solid-state devices. Typically, a single crystalline structure is fabricated monolithically on a single crystal substrate using lithographic techniques and wet/dry etching processes in combination with epitaxial growth techniques such as Solid Phase Epitaxy (SPE), Liquid Phase Epitaxy (LPE), Chemical Vapor Deposition (CVD), Molecular Beam Epitaxy (MBE) and Metal-Organic Vapor-Phase Epitaxy (MOVPE).

The Vapor-Liquid-Solid (VLS) method is an alternative technology to the previously mentioned techniques that facilitate growth of epitaxial whiskers. An epitaxial whisker is a hair-line structure grown epitaxially. In the VLS method, a metal particle is used as a seed. The seed particle, which can have catalytic properties, is heated in an environment containing vapors of gaseous precursor molecules along with optionally a semi-conducting material. Due to heating, a eutectic melt is formed in the seed particle. When the semi-conducting material in the seed particle reaches a critical saturation concentration, the semi-conducting material precipitates out of the seed particle in the form of a circular shaped structure with the same crystallographic orientation as the substrate.

The principle of the VLS method may also allow growth of epitaxial whiskers in a liquid environment. In this case, the gas phase is replaced by a liquid phase and the method is then called Liquid-Liquid-Solid (LLS) technique. Other family members of the VLS technique are Vapor-Solid-Solid (VSS) and Super-critical Liquid-Solid-Solid (LSS) techniques that differ from LLS because the seed particles remain in the solid state as opposed to a liquid state. Therefore, VLS is hereinafter used as synonym for LLS, VSS, and LSS.

It is known in the art that the shape and the position of the seed particle deposited on the substrate may change during annealing due to either uptake of substrate material, or formation of alloys with the adsorbed material from the gas or liquid phase. The shape and the position of the seed particle deposited on the substrate may also change due to annealing or surface diffusion. Further, the material properties of the structures produced using solid seed particles are inferior compared to the structures grown using liquid seed particles. The former structures exhibit more growth defects and have a reduced epitaxial relationship with the substrate. Further, the solid seed particles have generally a reduced efficiency to adsorb and catalyze precursor molecules and uptake material from the vapor or liquid environment.

FIG. 1a illustrates seed particles 102, 104, 106, 108 and 110 that act as seeds for crystal formation and are present on a substrate 112. It can be seen from the figure that seed particles 102, 104, 106, 108 and 110 present on substrate 112 are arbitrary-shaped. FIG. 1b depicts the top view of substrate 112 with seed particles 102, 104, 106, 108 and 110.

FIG. 1c illustrates the shape of seed particles 102, 104, 106, 108, 110a and 110b after the particles are annealed at eutectic temperature. The particles melt at eutectic temperature acquiring a circular shape. FIG. 1d depicts the top view of substrate 112 with seed particles 102, 104, 106, 108, 110a and 110b after the annealing process. It may be seen from the figure that after annealing, square-shaped seed particles 108 and 110 in FIG. 1a and FIG. 1b which were square shaped intentionally, become circular or drop-like due to the breaking up of the film. The film is broken up in small islands and droplets because of surface tension of seed particle 110 that reduces the exposed surface area of the seed particle forming seed particles 110a and 110b.

FIG. 1e illustrates substrate 112 with crystals 122, 124, 126, 128, 130 and 132 grown under seed particles 102, 104, 106, 108, 110a and 110b respectively. FIG. 1f depicts the top view of substrate 112 with crystals grown under the seed particles. It is apparent that the cross-section of the resulting crystals is limited to a circular shape since the liquefied seed particles acquire a circular shape during the growth process.

Thus, the VLS technology allows fabrication of defect-free, ultra-small semi-conducting structures that have essentially a circular-like shape (including for examples triangular or polygon like shapes that approximate a circular shape) only. Therefore, there is a need to devise a solution for growing crystalline structures of high quality which have a pre-defined cross-section. There is also a need to improve the smoothness of the structures by avoiding process damages induced during traditional micro-fabrication steps.

SUMMARY

The present invention provides for a method for forming a crystalline structure and the crystalline structure formed by the method.

In accordance with an embodiment of the present invention, there is provided a method for forming a structure of a desired cross-section on a substrate by providing a seed structure on the substrate. The seed structure includes at least one support layer having a geometric shape related to the desired cross-section of the structure. The method further includes growing the structure by supplying at least one precursor constituent to the seed structure. The desired cross-section of the structure is defined by the geometric shape of at least one support layer.

BRIEF DESCRIPTION OF THE DRAWINGS

The above and other items, features and advantages of the invention will be better understood by reading the following more particular description of the invention in conjunction with the accompanying drawings, wherein.

DETAILED DESCRIPTION

According to an embodiment of the present invention, there is provided a method for growing a structure of a predefined cross-section on a substrate. A seed structure comprising at least a support layer on the substrate is provided. The support layer has a geometric shape related to the desired cross-section of the structure. Further, the support layer may be diffusive to a precursor constituent. The structure is grown by supplying at least one precursor constituent to the seed structure. The desired cross-section of the structure is defined by the geometric shape of the support layer. In an embodiment of the present invention, semi-conducting nano-structures may be formed. The structure formed on the substrate includes a crystalline structure and is hereinafter referred interchangeably with the structure without deviating from the spirit and scope of the invention.

FIGS. 2a to 2d depict a layer stack 200 during different stages of formation of a crystalline structure, in accordance with an embodiment of the present invention.

Figure 1A:
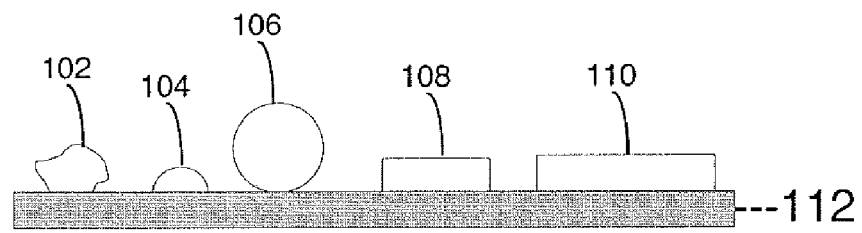
FIGS. 1a, 1c and 1e illustrate a cross-section of a substrate and seed particles known in the art.
Figure 1B:
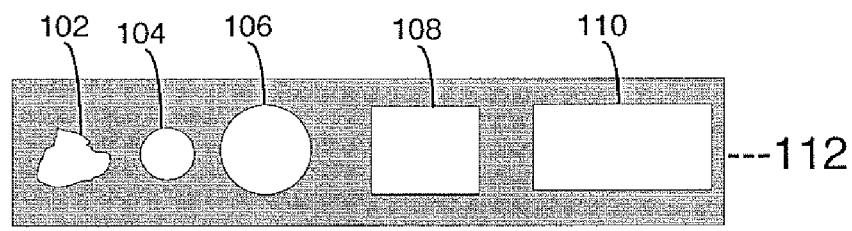
FIGS. 1b, 1d and 1f illustrate top views of the substrate with the seed particles known in the art.
Figure 1C:
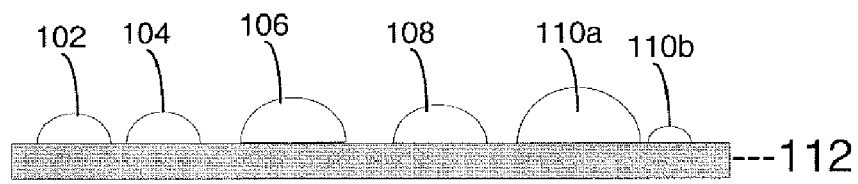
Figure 1D:
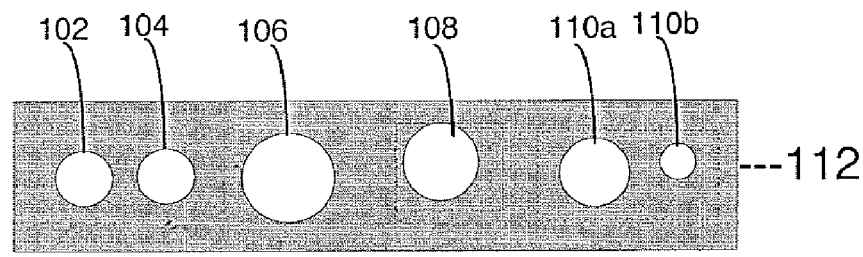
Figure 1E:
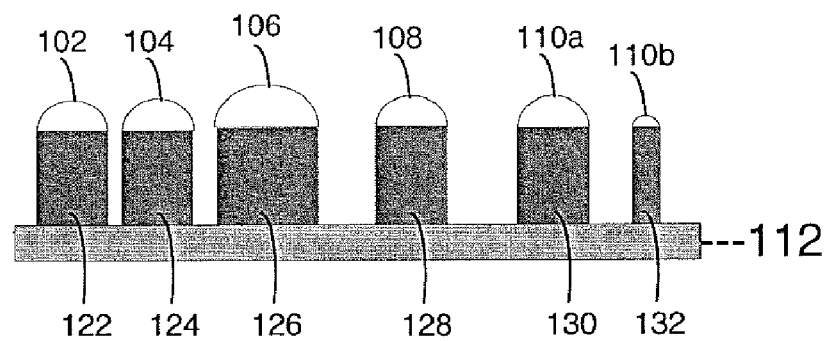
Figure 1F:
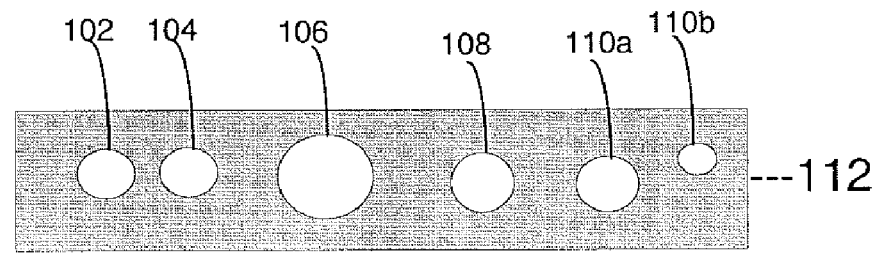
Figure 2A:
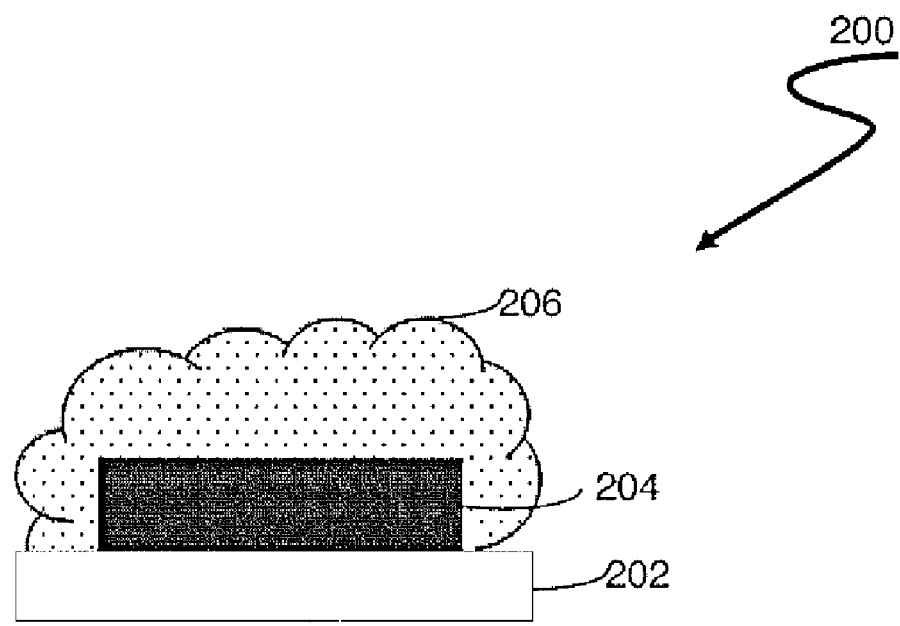
FIGS. 2a to 2d depict a layer stack during different stages of formation of a crystalline structure, in accordance with an embodiment of the present invention.

FIG. 2a shows one embodiment of layer stack 200 at an initial stage. The layer stack 200 comprises a substrate 202, and a support layer 204. The seed structure comprises the support layer 204, which is lithographically defined on substrate 202. A person skilled in the art will appreciate that other known techniques may be used to define the support layer. The geometric shape of support layer 204 defines the cross-section of the crystalline structure, which grows on substrate 202 during a heating process in the presence of precursor constituent 206. Further, support layer 204 may be diffusive to precursor constituent 206. Precursor constituent 206 may be present in an environment surrounding substrate 202. The cross-section of support layer 204 is geometrically stable over a temperature range of the heating process required for generation of the crystalline structure.

Figure 2B:
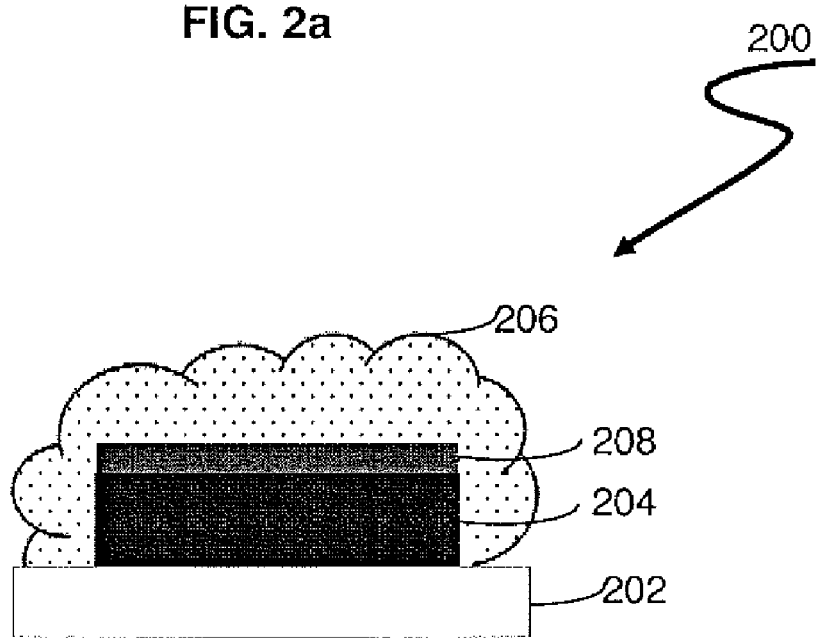

In another embodiment of the invention, as shown in FIG. 2b, a covering layer 208 is placed on top of support layer 204. In other words, the seed structure further includes a covering layer 208 in addition to support layer 204. Covering layer 208 adsorbs precursor constituent 206. Support layer 204 may be diffusive to precursor constituent 206 and the adsorbed precursor constituent of the covering layer 208. In this case, both support layer 204 and covering layer 208 are lithographically defined on substrate 202. A person skilled in the art will appreciate that other known techniques may be used to define the support layer and the covering layer. In order to grow the crystalline structure, the seed structure is heated in the presence of precursor constituent 206. In one embodiment of the invention, the seed structure is heated at eutectic temperature. Support layer 204 is mechanically strong to support covering layer 208 when covering layer 208 is in liquid state at the eutectic temperature during the heating process. The melting point of support layer 204 is higher than the melting point of covering layer 208. Both support layer 204 and covering layer 208 may be made from metals, metal alloys, silicides and germides, semiconductors or insulators. Support layer 204 may include a plurality of layers of semi-conducting, metallic, insulating materials or any combination thereof.

Covering layer 208 may be catalytically active and promote the adsorption of the precursor constituent 206 from the surrounding environment. In various embodiments of the invention, covering layer 208 may comprise metals Au, Ga, Ni, Pd, Fe, Al, Cu, or any combination thereof. In accordance with an embodiment of the present invention, precursor constituent 206 may be in the gaseous or liquid or super-critical liquid phase. The precursor constituent 206 may contain materials such as, for example, halides, halogens, silanes, germanes, metallo-organic compounds, molecules containing semiconductor constituents, and compositions of molecules containing boron, antimony, carbon, arsene, phosphorous, and sulphur.

Figure 2C:
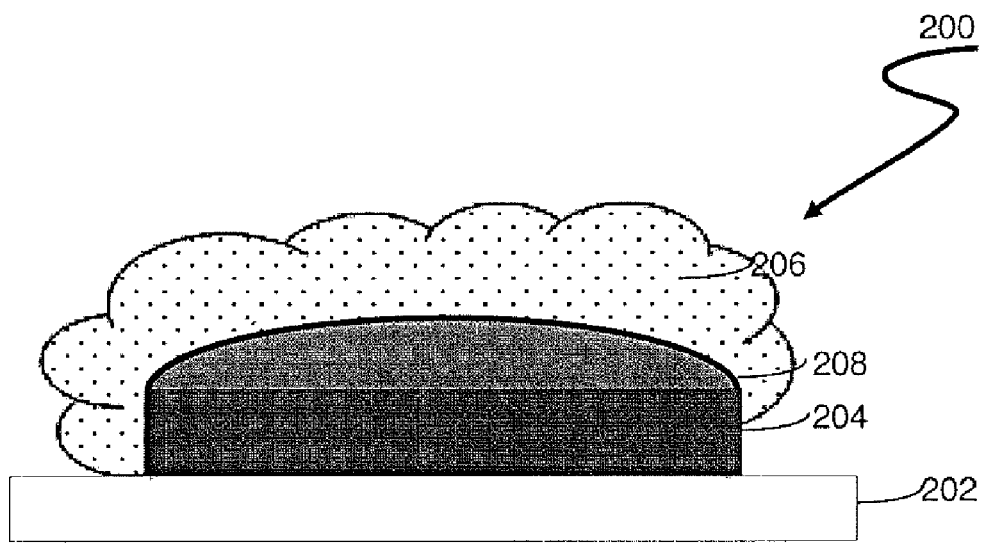

FIG. 2c shows layer stack 200 at the eutectic temperature in accordance with an embodiment of the present invention. Substrate 202 is heated in the presence of precursor constituent 206. Since covering layer 208 may liquefy at the eutectic temperature it preferentially wets and covers the entire interface with support layer 204. Alternatively, a liquefied covering layer 208 may wet a part of the interface with support layer 204. The material of support layer 204 is diffusive to the material collected and accumulated in the covering layer 208.

Support layer 204 may form a solid alloy during the heating process, including the material from covering layer 208 and the adsorbed precursor constituent. Prior to the heating process, the material, initial volume and initial shape of support layer 204 is defined. Depending on the heating temperature and the composition of the covering layer, the support layer 204 may form a solid alloy and its resulting shape can be determined. Thus, due to the formation of the solid alloy composition and the crystalline structure, the resulting change in volume and shape of support layer 204 may be calculated.

Figure 2D:
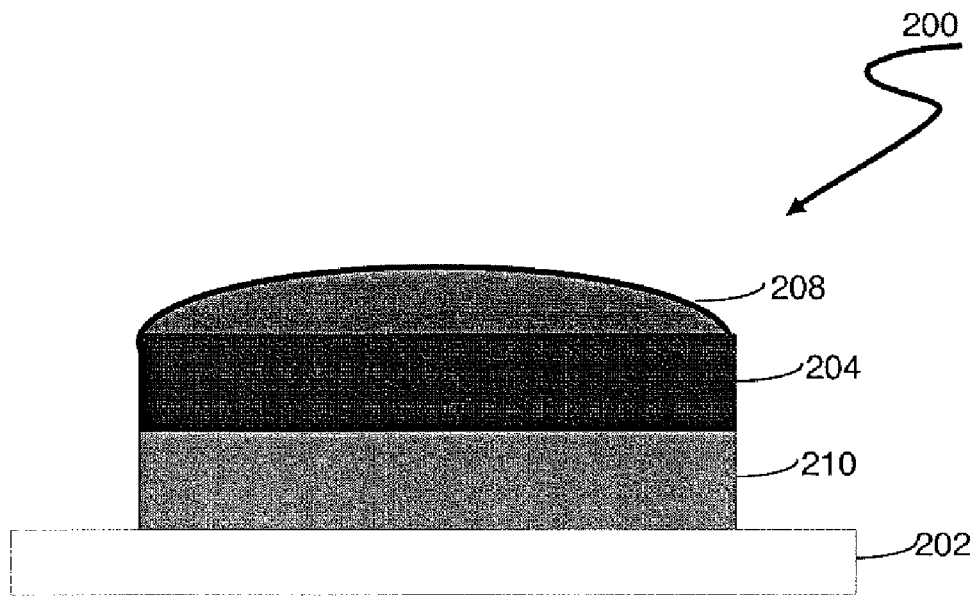

The precursor constituent 206 consequently adsorbs to and is partially taken up into covering layer 208 from which it may diffuse through support layer 204 and deposit on the interface of support layer 204 and substrate 202. The material, i.e., the precursor constituent 206 may deposit via precipitation and nucleation. Deposition may be epitaxial with substrate 202 or with the seed structure. Support layer 204 and substrate layer 202 must be selected such that precipitation of the material on support layer 204 or substrate layer 202 is energetically more favorable than on covering layer 208. Deposition of the precursor constituent allows growth of a crystalline structure 210 by lifting support layer 204 and covering layer 208 upwards as shown in FIG. 2d. As the crystalline structure 210 grows, it conforms to the cross-section defined by the support layer 204.

Figure 3A:
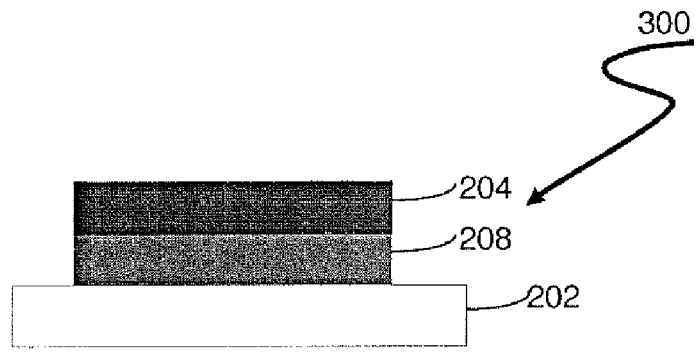
FIGS. 3a and 3b illustrate an alternative implementation of the layer stack in accordance with another embodiment of the present invention.
Figure 3B:
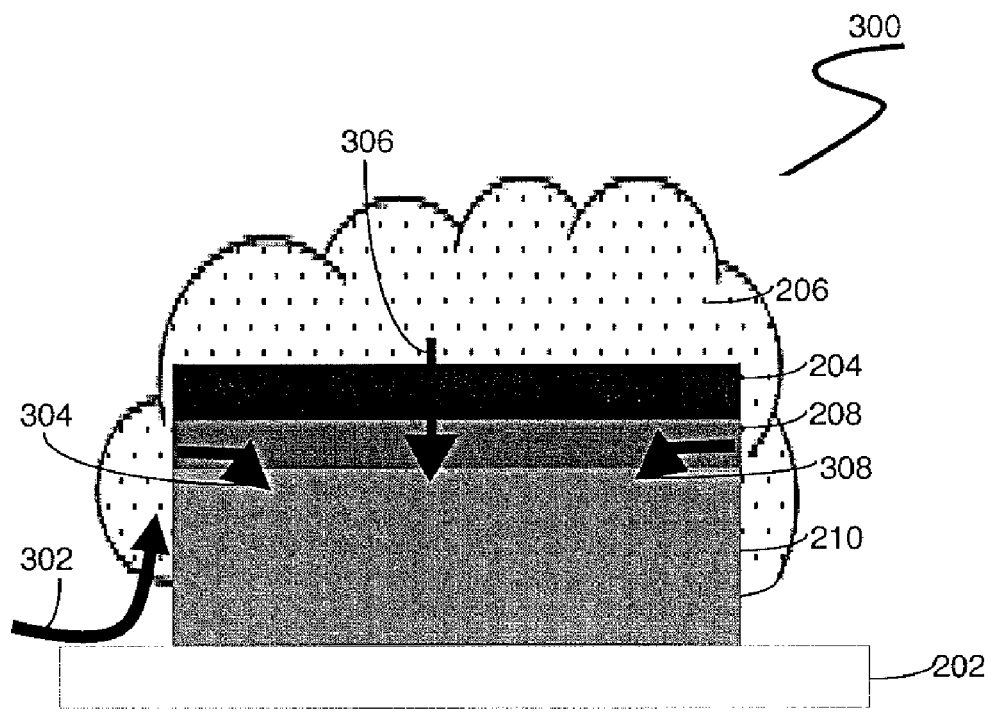

FIGS. 3a and 3b illustrate an alternative implementation of layer stack 200 in accordance with another embodiment of the present invention. FIG. 3a illustrates layer stack 300 at an initial stage. Layer stack 300 includes covering layer 208 placed over substrate 202 with support layer 204 placed on top of covering layer 208.

The shape and size of support layer 204 and covering layer 208 are defined, for example, lithographically, on substrate 202. A person skilled in the art will appreciate that other known techniques may be used to define the support layer and the covering layer. Support layer 204 has a pre-determined cross-section that is geometrically stable over a temperature range of the growth process of crystalline structure 210 and is related to the desired cross-section of crystalline structure 210. Other properties of support layer 204 and covering layer 208 are described in conjunction with FIG. 2.

FIG. 3b shows layer stack 300 during the growth of the crystalline structure in accordance with an alternative implementation of the present invention. The arrows 302, 304, 306 and 308 indicate the possible diffusive paths: interface and bulk diffusion. Upon heating layer stack 300 in the presence of precursor constituent 206, covering layer 208 may liquefy by adsorbing precursor constituent that may diffuse through support layer 204 or from the periphery of covering layer 208 into covering layer 208. Support layer 204 is wetted by covering layer 208. In one embodiment of the invention, when covering layer 208 is saturated with the diffused precursor constituent, the diffused precursor constituent deposits between covering layer 208 and substrate 202. Nucleation may be epitaxial with the substrate 202. Deposition of the diffused precursor constituent leads to lifting of support layer 204 and covering layer 208. The material of the support layer 204 is selected such that precipitation of the diffused precursor constituent on support layer 204 is energetically less favorable than on crystalline structure 210 being formed on substrate 202.

Support layer 204 may form a solid alloy during the heating process, including the material from covering layer 208 and precursor constituent 206. Prior to the heating process, the material, initial volume and initial shape of support layer 204 is defined. Depending on the heating temperature and the composition of covering layer 208, support layer 204 may form a solid alloy and its resulting shape can be determined. Thus, due to the formation of the solid alloy composition and the crystalline structure, the resulting change in volume and shape of support layer 204 may be calculated. Further, the change in volume and shape of covering layer 208 may be calculated if the solubility of the adsorbed precursor constituent and temperature of the same is known.

Figure 4:
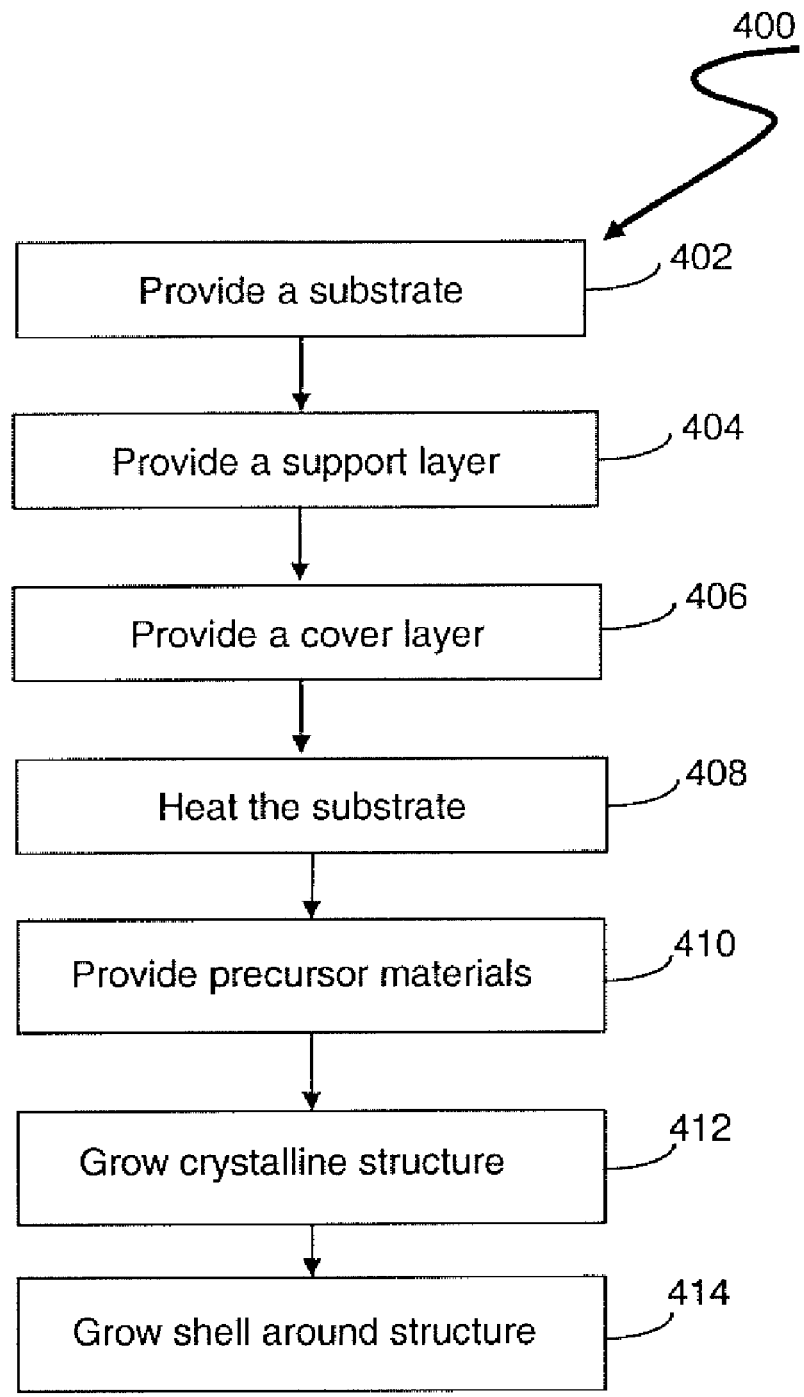
FIG. 4 illustrates a flowchart for a method of forming a crystalline structure.

FIG. 4 illustrates a flowchart for a method 400 of forming the crystalline structure of the desired cross-section on the substrate. The substrate is provided at step 402. At step 404, the support layer is deposited or otherwise formed on the substrate. The support layer has a geometric shape related to the desired cross-section of the crystalline structure. At step 406, the covering layer of the desired cross-section is formed adjacent to the support layer. The support layer and the covering layer can be deposited by vacuum evaporation, sputtering, ablation, or vapor deposition techniques or using chemical plating techniques. The desired cross-section can be defined by optical and electron beam lithography in conjunction with photo-resists and the use of sacrificial masks known in the art. The fabricated layered structure is heated (step 408) and the precursor constituents are added (step 410). The support layer and the covering layer are diffusive to at least one precursor constituent. The covering layer adsorbs precursor constituents and thereafter the precursor constituents are decomposed. A part of the decomposed precursor constituent desorbs from the covering layer while another part diffuses into the covering layer or along the surface of the covering layer. The diffusing material is subsequently transported further through the support layer or along the surface of the support layer towards the substrate surface where the crystalline structure is grown in step 412. The sequence of steps 408, 410, and 412 can be repeated to grow segments of alternating materials (heterostructures) or segments of defined impurity levels (doping).

More specifically, heterostructures and heteroepitaxial structures can be produced by adding a first precursor constituent for a defined amount of time (in step 410) to grow a first segment of the crystalline structure. The first precursor constituent is then removed by flushing in the case of a liquid environment, or, by evacuating in the case of a gaseous environment. A second precursor constituent is then supplied for a specific amount of time to grow a second segment on top of the first segment. This method results in a sharp interface between the two segments. However, a graded interface can be obtained as well by blending of the two precursor constituents. The crystalline structure exhibits a doping profile that can be achieved by adding small amounts of defined impurities to the growth process of the crystalline structures. This alters the electrical properties of the crystalline structure and allows fabrication of for example, p-n junctions. Further, in step 414, a shell is deposited on the surface of the crystalline structure to produce a core-shell structure. This can be accomplished by first growing a crystalline structure using above-mentioned steps followed by coating the entire structure with an additional layer using techniques known in the semiconductor field, for example, chemical vapor deposition, plasma enhanced chemical vapor deposition, atomic layer deposition, electro-less plating, and electroplating.

Figure 5A:
FIGS. 5a to 5f show different views of the layer stack before and after the growth of the crystalline structure in accordance with an embodiment of the present invention.
Figure 5B:
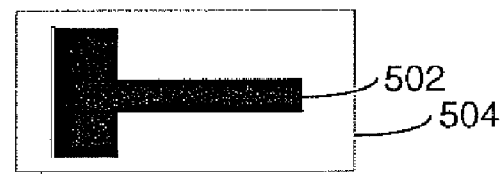

FIGS. 5a to 5f show different views of layer stack 200 or 300 before and after growth of the crystalline structure in accordance with an embodiment of the present invention. FIG. 5a shows the shape of layer structure 502 on substrate 504 before heating of substrate 504. Layer structure 502 comprises support layer 204 and covering layer 208 such that covering layer 208 is placed on either top or bottom of support layer 204. Layer structure 502 has a pre-determined cross-section and is deposited over substrate 504. The top view of layer stack 200 or 300 is depicted in FIG. 5b.

Figure 5C:
Figure 5D:
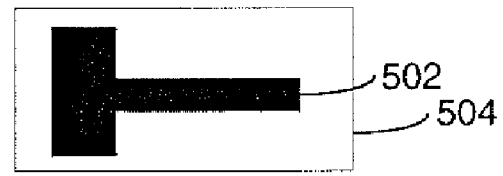

FIG. 5c depicts layer stack 200 or 300 on heating substrate 504. In an embodiment of the invention, at the eutectic temperature, the covering layer may liquefy. However, the shape of layer structure 502 is not altered as apparent from FIG. 5d. FIG. 5d depicts the top view of layer stack 200 or 300 at the growth temperature of the crystalline structure.

Figure 5E:
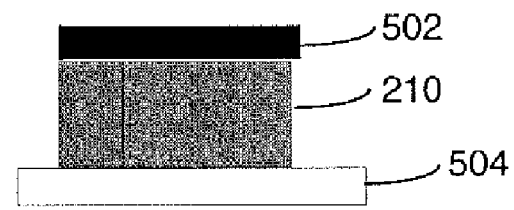
Figure 5F:
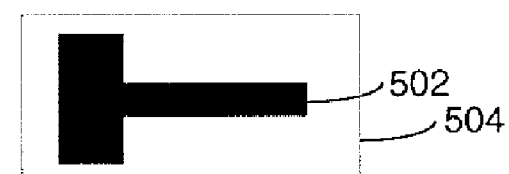

FIG. 5e shows layer stack 200 or 300 after the growth of crystalline structure 210. It may be seen from FIG. 5f that the top view of layer stack 200 or 300 with crystalline structure 210 is same as the top view of layer stack 200 or 300 before heating substrate 504 as depicted in FIG. 5b thus showing that the shape (or the desired cross-section) of crystalline structure 210 is similar to the cross-section of layer structure 502 which is defined by the support layer.

Although various embodiments which incorporate the teachings of the present invention have been shown and described in detail herein, those skilled in the art can readily devise many other varied embodiments that incorporate the teachings of the present invention.

What is claimed is:

1. A method of epitaxially growing a monocrystalline semiconductor region, comprising:
    a) lithographically defining a seed structure overlying a surface of a first monocrystalline semiconductor region of a substrate, the seed structure including (i) a support layer extending along the surface in a first lateral direction and a second lateral direction transverse to the first direction, the support layer having a major surface and a plurality of exposed lithographically defined edge surfaces bounding the major surface and extending away from the major surface, wherein an adjacent pair of the edge surfaces are disposed at an angle so as to define a vertex, the seed structure further including (ii) a catalytically active covering layer wetting the support layer and disposed between the surface of the semiconductor region and the support layer, the covering layer having an exposed periphery; and
    b) then selectively, epitaxially growing a second monocrystalline semiconductor region onto the first monocrystalline semiconductor region where covered by the seed structure by supplying precursor constituent to the seed structure including to the exposed periphery of the covering layer, such that the covering layer adsorbs the precursor constituent through the exposed periphery, the second monocrystalline semiconductor region having edge surfaces which are co-planar with the edge surfaces of the support layer.

2. The method of claim 1, wherein step (b) includes heating the seed structure in the presence of the precursor constituent.

3. The method of claim 1, wherein the support layer is diffusive to the precursor constituent.

4. The method of claim 1, wherein step (b) includes growing a first portion of the second monocrystalline semiconductor region having a first composition and growing a second portion of the second monocrystalline semiconductor region having a second composition to form a crystalline heterostructure.

5. The method of claim 4, wherein step (b) includes growing the first portion of the second monocrystalline semiconductor region to form a core region and growing the second portion of the second monocrystalline semiconductor region to form a shell region covering the core region.

6. The method of claim 1, wherein the geometric shape of the support layer is defined by lithography.

7. The method of claim 1, wherein each of the support layer and the cover layer comprises a material selected from a group comprising metals, metal alloys, semiconductors and insulators.

8. The method of claim 7, wherein the metals comprise one of gold, gallium, nickel, lead, iron, copper, and aluminum or any combination thereof.

9. The method of claim 1, wherein the precursor constituent is selected from a group comprising halides, halogens, silanes, germanes, metallo-organic compounds, molecules containing semiconductor constituents, and compositions of molecules containing boron, antimony, carbon, arsene, phosphorous, and sulphur.

10. A method of epitaxially growing a monocrystalline semiconductor region, comprising:
   a) lithographically defining a seed structure overlying a surface of a first monocrystalline semiconductor region of a substrate, the seed structure including (i) a support layer extending along the surface in a first lateral direction and a second lateral direction transverse to the first direction, the support layer having a major surface and a plurality of exposed lithographically defined edge surfaces bounding the major surface and extending away from the major surface, wherein an adjacent pair of the edge surfaces are disposed at an angle so as to define a vertex, the seed structure further including (ii) a catalytically active covering layer wetting the support layer and disposed between the surface of the semiconductor region and the support layer, the covering layer having an exposed periphery; and
   b) then selectively, epitaxially growing a second monocrystalline semiconductor region onto the first monocrystalline semiconductor region where covered by the seed structure using a precursor constituent adsorbed by the covering layer through at least the exposed periphery of the covering layer, the second monocrystalline semiconductor region having edge surfaces which are co-planar with the edge surfaces of the support layer.

11. A structure including an epitaxially grown monocrystalline semiconductor region, comprising:
   a seed structure overlying a surface of a first monocrystalline semiconductor region of a substrate, the seed structure including (i) a support layer extending along the surface in a first lateral direction and a second lateral direction transverse to the first direction, the support layer having a major surface and a plurality of exposed lithographically defined edge surfaces bounding the major surface and extending away from the major surface, wherein an adjacent pair of the edge surfaces are disposed at an angle so as to define a vertex, the seed structure further including (ii) a catalytic covering layer wetting the support layer and disposed between the surface of the semiconductor region and the support layer, the covering layer having an exposed periphery; and
   a second monocrystalline semiconductor region selectively, epitaxially grown onto the first monocrystalline semiconductor region where covered by the seed structure using a precursor constituent adsorbed by the cover layer through at least the exposed periphery of the covering layer, the second monocrystalline semiconductor region having edge surfaces which are co-planar with the edge surfaces of the support layer.

12. The structure as claimed in claim 11, wherein the support layer is diffusive to the precursor constituent.

13. The structure as claimed in claim 12, wherein the structure is an in-process structure.

14. The structure as claimed in claim 11, further comprising growing a third semiconductor region to form a shell region covering the core region.

15. The structure as claimed in claim 11, wherein the edge surfaces of the support layer is defined by lithography.

16. The structure as claimed in claim 11, wherein the support layer includes a material selected from a group comprising a metal, metal alloys, semiconductors and insulators.

17. The structure as claimed in claim 11, wherein the metal includes at least one metal selected from the group consisting of gold, gallium, nickel, lead, iron, copper, and aluminum.

18. The structure as claimed in claim 11, wherein the precursor constituent includes at least one selected from the group consisting of halides, halogens, silanes, germanes, metallo-organic compounds; molecules containing semiconductor constituents, and compositions of molecules containing boron, antimony, carbon, arsene, phosphorous, and sulphur.

* * * * *